US010967450B2

(12) United States Patent
Ojha et al.

(10) Patent No.: US 10,967,450 B2
(45) Date of Patent: Apr. 6, 2021

(54) SLICING SIC MATERIAL BY WIRE ELECTRICAL DISCHARGE MACHINING

(71) Applicant: Infineon Technologies AG, Neubiberg (DE)

(72) Inventors: Nirdesh Ojha, Villach (AT); Francisco Javier Santos Rodriguez, Villach (AT); Roland Rupp, Lauf (DE); Markus Heinrici, Villach (AT); Karin Delalut, Klagenfurt (AT); Claudia Friza, Villach (AT)

(73) Assignee: Infineon Technologies AG, Neubiberg (DE)

( * ) Notice: Subject to any disclaimer, the term of this patent is extended or adjusted under 35 U.S.C. 154(b) by 224 days.

(21) Appl. No.: 15/971,830

(22) Filed: May 4, 2018

(65) Prior Publication Data

US 2019/0337069 A1 Nov. 7, 2019

(51) Int. Cl.
*B23H 7/06* (2006.01)
*B23H 7/10* (2006.01)
(Continued)

(52) U.S. Cl.
CPC ............ *B23H 7/06* (2013.01); *B23H 1/022* (2013.01); *B23H 7/101* (2013.01); *B23H 7/14* (2013.01); *B23H 7/30* (2013.01); *B23H 7/34* (2013.01)

(58) Field of Classification Search
CPC ......... H01L 21/02529; H01L 21/02378; H01L 21/02634; H01L 21/02447; H01L 21/046; H01L 21/823431; H01L 21/02658; H01L 21/20; H01L 21/0445; H01L 21/8213; H01L 21/823412; H01L 21/823418; H01L 21/02002; H01L 21/02008; H01L 21/6835; H01L 21/76254; H01L 21/02167; H01L 21/02505; H01L 21/78; H01L 21/7806;
(Continued)

(56) References Cited

U.S. PATENT DOCUMENTS

| 3,914,170 | A | 10/1975 | Ballard et al. |
| 4,131,524 | A | 12/1978 | Gieles |

(Continued)

FOREIGN PATENT DOCUMENTS

| DE | 102014104630 A1 | 10/2014 |
| JP | 4411837 B2 * | 2/2010 |

OTHER PUBLICATIONS

Nirdesh Ojha Electrical Discharge Machining of Non-Conductive Advance Ceramics 2015 (Year: 2015).*

(Continued)

*Primary Examiner* — Justin C Dodson
*Assistant Examiner* — William C. Gibson
(74) *Attorney, Agent, or Firm* — Murphy, Bilak & Homiller, PLLC

(57) ABSTRACT

A method of yielding a thinner product wafer from a thicker base SiC wafer cut from a SiC ingot includes: supporting the base SiC wafer with a support substrate: and while the base SiC wafer is supported by the support substrate, cutting through the base SiC wafer in a direction parallel to a first main surface of the base SiC wafer using a wire as part of a wire electrical discharge machining (WEDM) process, to separate the product wafer from the base SiC wafer, the product wafer being attached to the support substrate when cut from the base SiC wafer.

20 Claims, 12 Drawing Sheets

(51) Int. Cl.
*B23H 7/14* (2006.01)
*B23H 7/30* (2006.01)
*B23H 7/34* (2006.01)
*B23H 1/02* (2006.01)

(58) Field of Classification Search
CPC ....... H01L 21/823437; H01L 21/02664; H01L 21/02694; H01L 29/1608; H01L 29/66068; H01L 29/165; H01L 29/7848; H01L 29/36; H01L 29/6656; H01L 29/7851; H01L 29/41741; H01L 29/06; H01L 29/0692; H01L 29/402; H01L 29/105; H01L 29/267; H01L 29/34; H01L 29/401; H01L 29/6605; H01L 2221/68345; H01L 2224/06181; H01L 23/3171; H01L 24/06; H01L 2924/10272; H01L 2221/68327; H01L 2224/11; H01L 23/3121; H01L 24/03; H01L 25/50
USPC ....... 117/1, 2, 9, 97, 915, 19, 200, 937, 951, 117/101; 428/64.1, 53, 926; 427/457, 427/523; 219/68, 69.17, 69.12, 69.11, 219/121.67, 121.69, 69.15, 137 R, 201, 219/262, 69.18, 69.2; 83/16, 171, 651.1, 83/870, 953
See application file for complete search history.

(56) References Cited

U.S. PATENT DOCUMENTS

| | | | |
|---|---|---|---|
| 5,429,984 | A | 7/1995 | Masaki |
| 6,180,435 | B1 | 1/2001 | Ise et al. |
| 9,219,049 | B2 | 12/2015 | Berger et al. |
| 9,576,844 | B2 | 2/2017 | Berger et al. |
| 9,704,750 | B2 | 7/2017 | Rupp et al. |
| 9,793,167 | B2 | 10/2017 | Rupp et al. |
| 10,020,226 | B2 | 7/2018 | Rupp et al. |
| 2004/0058478 | A1 | 3/2004 | Islam et al. |
| 2005/0186711 | A1 | 8/2005 | Yee et al. |
| 2005/0263864 | A1 | 12/2005 | Islam et al. |
| 2006/0001130 | A1 | 1/2006 | Islam et al. |
| 2009/0275152 | A1 | 11/2009 | Rommeveaux et al. |
| 2010/0244047 | A1* | 9/2010 | Hull .................... H01L 29/0847 257/77 |
| 2014/0020951 | A1 | 1/2014 | Shah et al. |
| 2014/0264374 | A1* | 9/2014 | Hecht ............... H01L 21/02529 257/77 |
| 2015/0115458 | A1 | 4/2015 | Palm |
| 2015/0206802 | A1 | 7/2015 | Roesner et al. |
| 2015/0279941 | A1* | 10/2015 | Berger .................... H01L 29/02 257/9 |
| 2016/0225856 | A1 | 8/2016 | Berger et al. |
| 2016/0260699 | A1 | 9/2016 | Lehnert et al. |
| 2016/0307754 | A1* | 10/2016 | Chang ............... H01L 21/02002 |
| 2017/0018614 | A1 | 1/2017 | Rupp et al. |
| 2017/0278930 | A1 | 9/2017 | Ruhl et al. |
| 2018/0021919 | A1 | 1/2018 | Lehner |
| 2018/0047619 | A1 | 2/2018 | Lehnert et al. |
| 2018/0158916 | A1 | 6/2018 | Schulze et al. |
| 2018/0229320 | A1* | 8/2018 | Miyake .................. B23H 1/028 |

OTHER PUBLICATIONS

Florian Zeller Electrical Discharge Milling of Silicon Carbide with different Electrical Conductivity 2014 (Year: 2014).*
Campana, et al., "Micro-EDM and ECM in DI water", Proceedings of Annual Meeting of American Society of Precision Engineering (ASPE), 1999, pp. 1-4.
Gatzen, et al., "Electroplated Cu Micro Electrode for Application in Micro Electrostatic Discharge Machining (EDM)", 214th Electrochemical Society Meeting, 2008, p. 1.
Kibria, et al., "Experimentation and Analysis into Micro-Hole Machining in EDM on Ti-6al-4v Alloy Using Boron Carbide Powder Mixed De-Ionized Water", International Journal of Materials, Manufacturing and Design, 2012, vol. 1, No. 1, Academic Research Journals, pp. 17-35.
Ojha, Nirdesh, "Electrical Discharge Machining of Non-Conductive Advanced Ceramics", PhD Thesis, Albert-Ludwigs-Universität Freiburg, Oct. 29, 2015.
Ojha, Nirdesh, et al., "Major parameters affecting the electric discharge machining of non-conductive SiC", Proceedings of the 10th International Conference on Multi-Material Micro Manufacture, 2013.
Ojha, Nirdesh, et al., "Methods of Thinning and Structuring Semiconductor Wafers by Electrical Discharge Machining", U.S. Appl. No. 15/935,867, filed Mar. 26, 2018.
Ojha, Nirdesh, et al., "The Effect of the EDM Process on the Material Properties of Non-conductive Ceramics", Journal of Micro and Nano-Manufacturing 4 (1), 2016.
Zeller, Florian, et al., "Influence of Pulse Width on Micro Electrical Discharge Machining of Non-Conductive Silicon Carbide", Proceedings of the 4M/ICOMM2015 Conference, 2015.
Zhao, Yonghua, et al., "EDM mechanism of single crystal SiC with respect to thermal, mechanical and chemical aspects", Journal of Materials Processing Technology 236, 2016, pp. 138-147.
"Pilot line for low-cost SiC wafer to launch in 2016", Semiconportal, Aug. 22, 2014, Accessed online May 4, 2018 at https://www.semiconportal.com/en/archive/news/news-by-sin/140822-sicoxs-sic-wafer.html.
Zeller, Florian et al., "Electrical Discharge Milling of Silicon Carbide with different Electrical Conductivity", Key Engineering Materias, vols. 611-612, 2014, pp. 677-684.
Zhao, Y. et al., "Experimental investigations into EDM behaviors of single crystal silicon carbide", The Seventeenth CIRP Conference on Electro Physical and Chemical Machining (ISEM), Procedia CIRP 6, 2013, pp. 135-139.
Zhao, Yonghua et al., "Study of EDM cutting of single crystal silicon carbide", Precision Engineering 38, 2014, pp. 92-99.

* cited by examiner

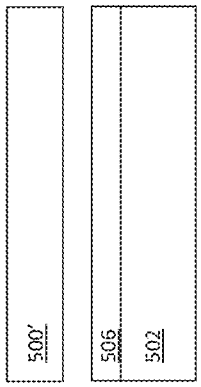
Figure 5A
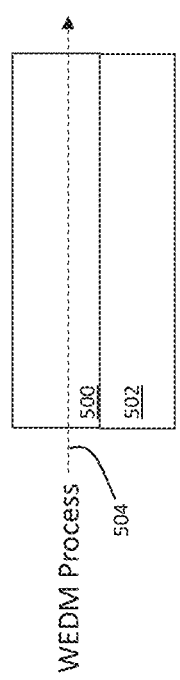
Figure 5B
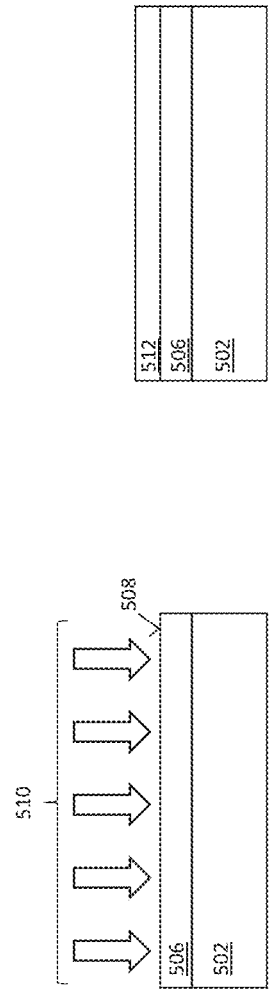
Figure 5C
Figure 5D

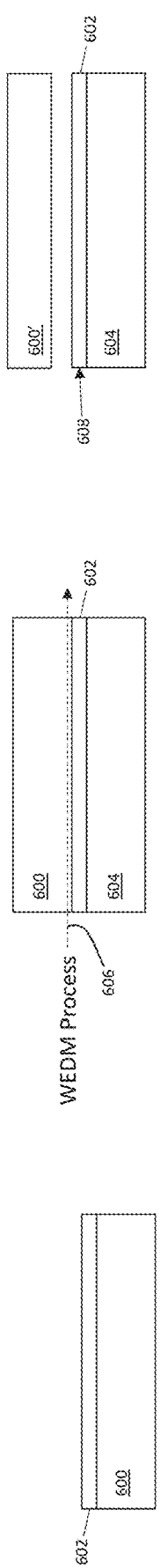
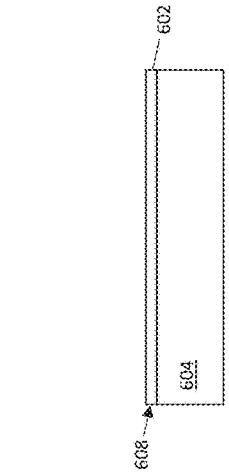
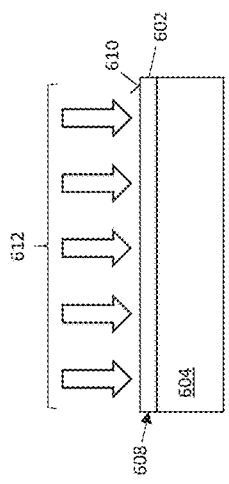
Figure 6A
Figure 6B
Figure 6C
Figure 6D
Figure 6E

Figure 7A
Figure 7B
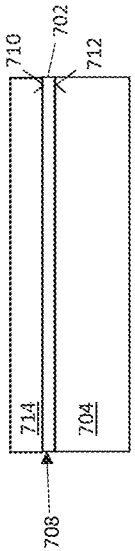
Figure 7C
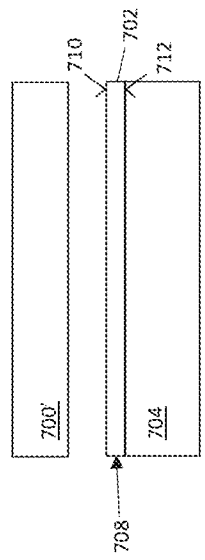
Figure 7D

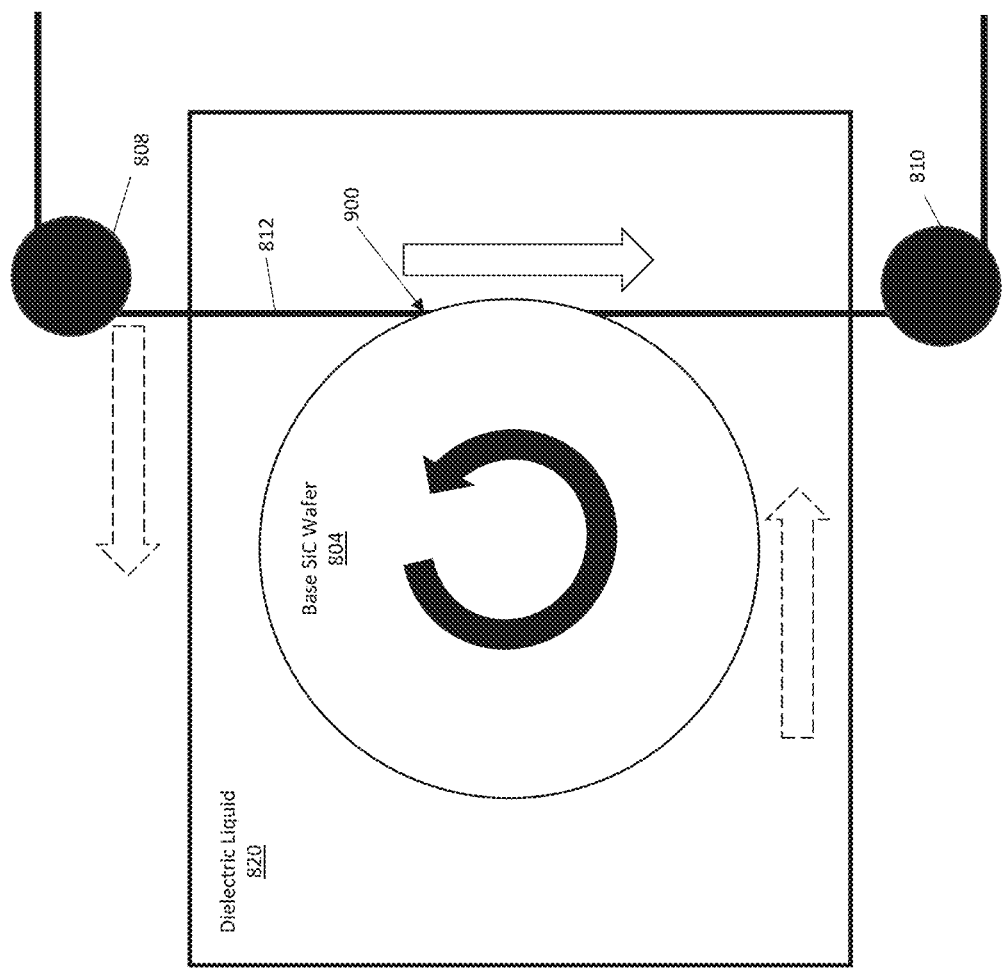

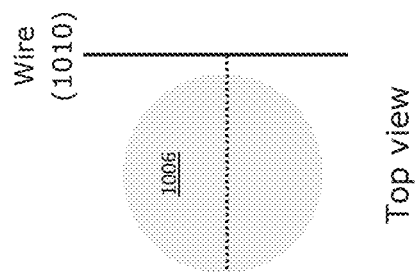
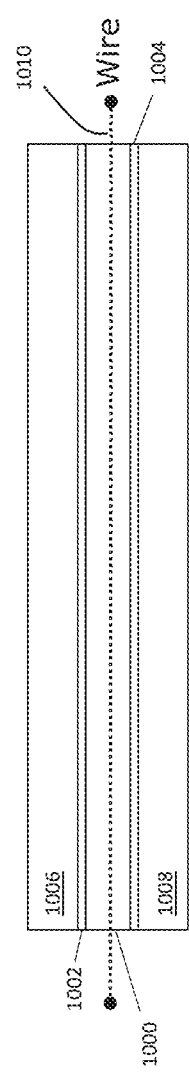
Figure 11A
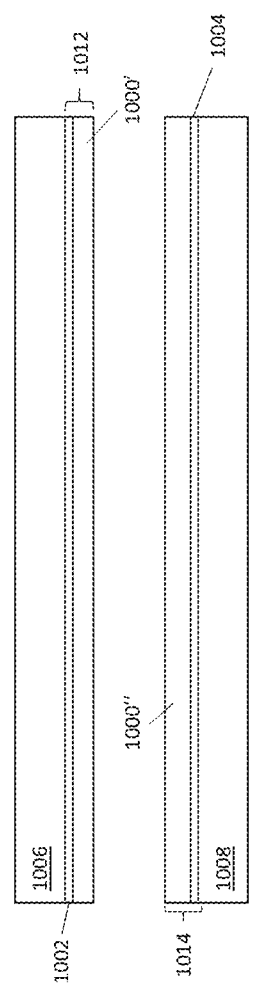
Figure 11B

SLICING SIC MATERIAL BY WIRE ELECTRICAL DISCHARGE MACHINING

BACKGROUND

SiC is increasingly being used as a semiconductor material for power semiconductor devices due to its material properties. Compared to Si, SiC-based power semiconductor devices provide higher efficiency, withstand higher breakdown voltage, operate at higher speed and require smaller package housings. However, compared to Si, SiC wafers are more expensive. SiC wafers are cut from a SiC ingot at a typical thickness of several hundred micrometer to provide sufficient mechanical stability during handling and device processing. Power semiconductor devices fabricated from a SiC wafer tend to be significantly thinner (e.g. 100 μm or less) than the initial wafer thickness, requiring a back-side thinning process such as polishing. Given the high cost of SiC wafers, the thinning process can be viewed as wasteful.

Hence, new methods for reusing SiC wafers are needed.

SUMMARY

According to an embodiment of a method of yielding a thinner product wafer from a thicker base SiC wafer cut from a SiC ingot, the method comprises: supporting the base SiC wafer with a support substrate; and while the base SiC wafer is supported by the support substrate, cutting through the base SiC wafer in a direction parallel to a first main surface of the base SiC wafer using a wire as part of a wire electrical discharge machining (WEDM) process, to separate the product wafer from the base SiC wafer, the product wafer being attached to the support substrate when cut from the base SiC wafer.

According to an embodiment of a wire electrical discharge machining (WEDM) apparatus, the WEDM apparatus comprises: a chuck configured to receive a base SiC wafer with a support substrate, and to rotate the base SiC and the support substrate during a WEDM process; first and second spools configured to feed a wire; and a controller configured to control rotation of the chuck and feeding of the wire between the first and the second spools so as to cut through the base SiC wafer in a direction parallel to a first main surface of the base SiC wafer using the wire during the WEDM process and separate a product wafer from the base SiC wafer, the product wafer being attached to the support substrate when cut from the base SiC wafer.

According to an embodiment of a SiC product wafer, the SiC product wafer comprises a SiC body having a thickness of less than 100 μm and being devoid of implanted hydrogen.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

FIGS. 5A through 5D illustrate side perspective views of an embodiment of the method shown in FIG. 1.

FIGS. 6A through 6E illustrate side perspective views of an embodiment of the method shown in FIG. 1.

FIGS. 7A through 7D illustrate side perspective views of an embodiment of the method shown in FIG. 1.

FIG. 10 illustrates a top plan view of an embodiment of a wafer cutting configuration for the WEDM apparatus shown in FIG. 8.

FIGS. 11A and 11B illustrate side perspective views of an embodiment of the method shown in FIG. 1.

DETAILED DESCRIPTION

Embodiments described herein provide for the cutting and reuse of SiC wafers using a wire electrical discharge machining (WEDM) process. A thinner product wafer is yielded from a thicker base SiC wafer cut from a SiC ingot, by supporting the base SiC wafer with a support substrate and cutting through the supported base SiC wafer in a direction parallel to a first main surface of the base SiC wafer using a wire as part of a WEDM process. In addition to cutting through a base SiC wafer using the WEDM process described herein, the WEDM process also can be used to cut through SiC epitaxial layers. Hence, in the following description, the base SiC wafer being cut by the WEDM process instead may be one or more SiC epitaxial layers.

Figure 1:
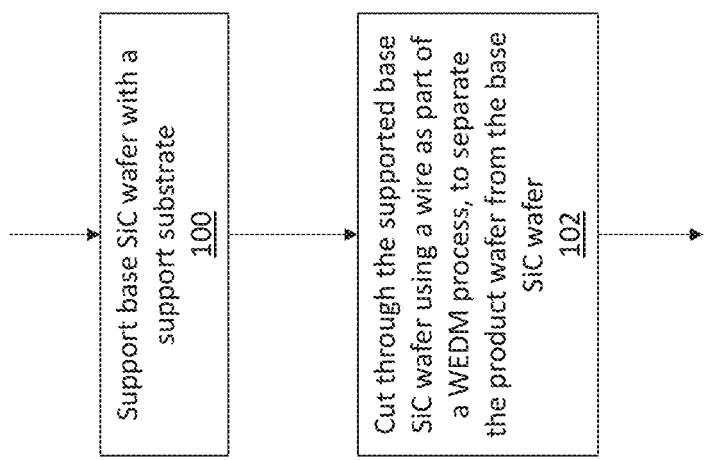
FIG. 1 illustrates a flow diagram of an embodiment of a method of yielding a thinner product wafer from a thicker base SiC wafer cut from a SiC ingot, using a wire electrical discharge machining (WEDM) process.

FIG. 1 illustrates an embodiment of a method of yielding a thinner product wafer from a thicker base SiC wafer cut from a SiC ingot. Hence, the SiC ingot itself is not processed according to the WEDM embodiments described herein but rather a base wafer cut from the SiC ingot. The method comprises supporting the base SiC wafer with a support substrate (Block 100). Any type of support substrate suitable for providing mechanical support during cutting and/or subsequent processing may be used such as, but not limited to, a glass carrier, a ceramic carrier, a metal carrier, a semiconductor wafer, etc. While the base SiC wafer is supported by the support substrate, the method further comprises cutting through the base SiC wafer in a direction parallel to a first main (top or bottom) surface of the base SiC wafer using a wire (foil) as part of a wire electrical discharge machining (WEDM) process, to separate the product wafer from the base SiC wafer (Block 102). The first main surface of the base SiC wafer may be the surface along which the SiC wafer extends. The first main surface may run along horizontal directions. Perpendicular to the first main surface, in a vertical direction, the SiC wafer has a thickness that is small compared to an extent of the SiC wafer along the first main surface. The product wafer is attached to the support substrate when cut from the base SiC wafer. The terms 'wire' and 'foil' are used interchangeably herein to describe the WEDM tool electrode used to cut/slice through the base SiC wafer to yield the thinner product wafer.

The WEDM process cuts through the base SiC wafer in a generally horizontal direction by machining/removing semiconductor material by sublimation, melting, decomposition and/or spelling. With wire WEDM, the tool electrode may be a wire (foil). The wire may be wound between two spools so that the active part of the wire changes. The base SiC wafer itself and/or an assisting electrode applied to the base SiC wafer forms the other electrode. A power supply applies voltage pulses between the wire and the other electrode as part of the WEDM process. No direct physical contact occurs between the wire and the base SiC wafer. Hence, the WEDM process may be used to cut through semiconductor material much harder than the wire, e.g. such as SiC.

In one embodiment, the thinner product wafer cut from the base SiC wafer via the WEDM process has a thickness of less than 100 µm. For example, the product wafer may be cut to a thickness of less than 20 µm by the WEDM process. In general, the product wafer cut from the base SiC wafer in accordance with the WEDM method shown in FIG. 1 may have any desired thickness, which may depend on the end use application of the functional devices fabricated from the product wafer.

The base SiC wafer may be reused in the same or similar manner to yield one or more additional product wafers. The base SiC wafer may or may not be partially processed in advance of the WEDM cutting process, e.g. by forming (e.g. growing) an epitaxial SiC layer on the base SiC wafer and/or forming one or more doped regions of a functional device in the epitaxial SiC layer. The product wafer cut from the base SiC wafer may be used to fabricate power semiconductor devices such as transistors, diodes, etc. The base SiC wafer and/or the thinner product wafer cut from the base SiC wafer by the WEDM process may be processed post cutting to remove surface damage caused by the WEDM process.

Figure 2A:
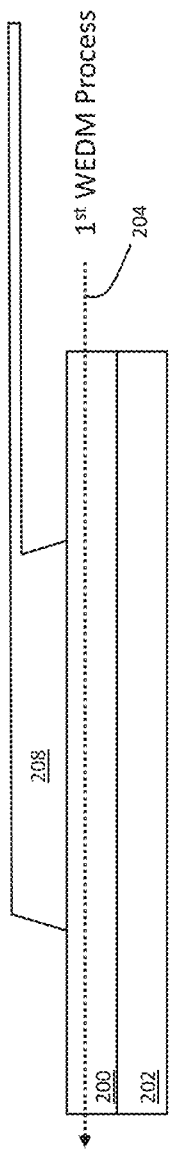
FIGS. 2A through 2C illustrate side perspective views of an embodiment of the method shown in FIG. 1.
Figure 2B:
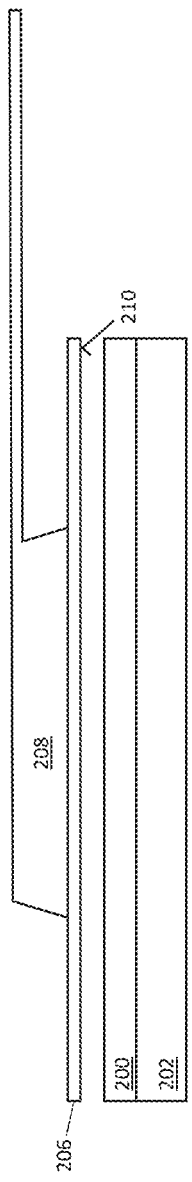
Figure 2C:
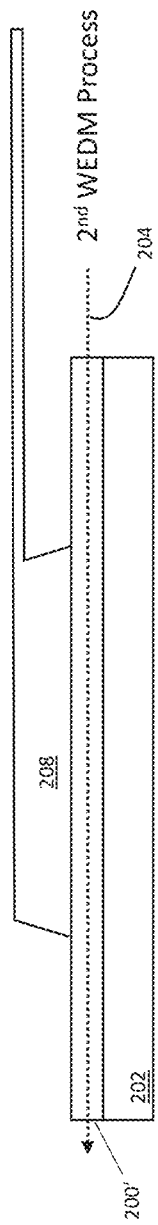

FIGS. 2A through 2C illustrate an embodiment of the method shown in FIG. 1.

FIG. 2A shows a base SiC wafer 200 cut from a SiC ingot and supported by a support substrate 202 during a first WEDM cutting process. During the first WEDM process, the base SiC wafer 200 is cut through in a direction parallel to a first main (top or bottom) surface of the base SiC wafer 200 using a wire 204 to separate the first thinner product wafer 206 from the base SiC wafer 200. According to this embodiment, an epitaxial SiC layer is not grown on the base SiC wafer 200 prior to the first WEDM cutting process.

FIG. 2B shows the first thinner product wafer 206 separated from the base SiC wafer 200 after the WEDM process is complete. The first thinner product wafer 200 is carried away by a vacuum collet 208 for further processing, such as polishing, laser annealing, etc. of the cut surface 210 to remove surface damage caused by the WEDM process, growing of an epitaxial SiC layer on the polished surface, device fabrication e.g. by forming doped device regions such as source/drain/emitter/collector/anode/cathode regions, metallization, etc.

FIG. 2O shows the remaining base SiC wafer 200' being reused to form a second product wafer. The remaining base SiC wafer 200' is again supported by the same or different support substrate 202 during a second WEDM cutting process. The remaining base SiC wafer 200' is cut through in a direction parallel to a first main (top or bottom) surface of the remaining base SiC wafer 200' using the same or different wire 204, to separate a second product wafer from the remaining base SiC wafer 200'. Similar to FIG. 2A, an epitaxial SiC layer is not grown on the remaining base SiC wafer 200' prior to the second WEDM cutting process.

The second thinner product wafer is carried away by a vacuum collet 208 for further processing after the second WEDM process is complete. The WEDM process may be repeated one or more additional times, depending on the remaining thickness of the remaining base SiC wafer 200'. That is to say, further WEDM cutting processes may follow the second WEDM cutting process, wherein each further cutting process may result in a further thinner product wafer being cut from the base SiC wafer 200' remaining from the previous WEDM cutting process and wherein each further thinner product wafer may be carried away by a vacuum collet 208. The remaining SiC wafer 200' of the previous WEDM cutting process may be the initial base SiC wafer 200 of the subsequent WEDM cutting process.

For example, the typical initial thickness of a base SiC wafer 200 is about 375 µm prior to WEDM processing. After the first WEDM cutting process, the remaining base SiC wafer 200' may have a remaining thickness of about 250 µm if the first thinner product wafer 206 has a thickness of about 75 µm and about 50 µm of semiconductor material is removed about equally from the base SiC wafer 200 and the first thinner product wafer 206 as part of the first WEDM process. In this purely illustrative example, at least one additional product wafer can be cut from the remaining base SiC wafer 200' during a subsequent WEDM process.

In general, the remaining base SiC wafer 200' may have a larger remaining thickness than the thinner product wafer 206. Alternatively, the remaining base SiC wafer 200' may have a smaller remaining thickness than the thinner product wafer 206. This may, for instance, be the case if the initial thickness of the base SiC wafer 200, i.e. the thickness of the base SiC wafer 200 before the first WEDM cutting process and/or before any subsequent WEDM cutting process, is smaller than a minimum thickness of the thinner product wafer 206 that is required for allowing mechanical handling of the thinner product wafer 206.

For example, the thinner product wafer 206 may have a thickness of at least 50 µm, for example at least 75 µm or at least 100 µm. A thinner product wafer 206 with a thickness of less than 50 µm might lack the mechanical stability required for removing the thinner product wafer 206, e.g., with a vacuum collet 208.

The thickness numbers provided above are merely for illustrative purposes only and should not be considered limiting in any way. The number of thinner product wafers cut from a starting base SiC wafer by the WEDM method illustrated in FIG. 1 depends on the initial thickness of the base SiC wafer, the target thickness for each thinner product wafer cut from the base SiC wafer, whether an epitaxial layer is grown on the base SiC wafer prior to WEDM cutting, and/or the amount of semiconductor material spent by each instance of the WEDM cutting process. The thicker the starting SiC wafer, the more product wafers that can be formed from the same base wafer. In some cases, the base SiC wafer may have an initial thickness greater than the 375 µm example given above, e.g. 1 mm or even thicker.

FIGS. 3A through 3F illustrate another embodiment of the method shown in FIG. 1.

Figure 3A:
FIGS. 3A through 3F illustrate side perspective views of an embodiment of the method shown in FIG. 1.

FIG. 3A shows a base SiC wafer 300 after an epitaxial SiC layer 302 is grown on the base SiC wafer 300. The epitaxial SiC layer 302 may be doped or undoped. In the case of a doped epitaxial SiC layer 302, the epitaxial SiC layer 302 may include one or more doped device regions such as source/drain/emitter/collector/anode/cathode regions. Any standard SiC epitaxy process may be used to grow the epitaxial SiC layer 302 on the base SiC wafer 300.

Figure 3B:
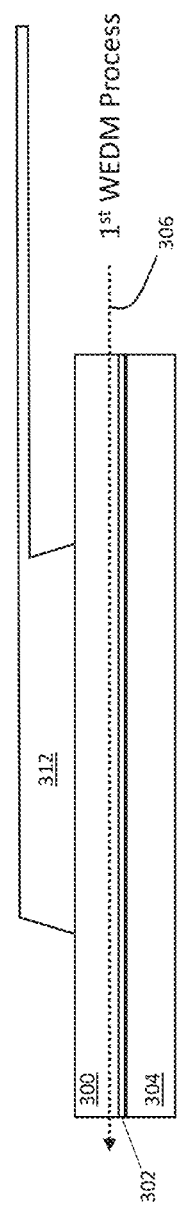

FIG. 3B shows the base SiC wafer 300 with the epitaxial SiC layer 302 after the wafer 300 is flipped, attached to a support substrate 304 and being cut as part of a first WEDM cutting process. The support substrate 304 may be attached to a surface of the epitaxial SiC layer 302 which faces away from the base SiC wafer 300 so that the epitaxial SiC layer 302 is interposed between the support substrate 304 and the base SiC wafer 300. The base SiC wafer 300 is cut through in a direction parallel to a first main (top or bottom) surface of the base SiC wafer 300 using a wire 306, to separate a thinner product wafer 308 from the base SiC wafer 300.

Figure 3C:
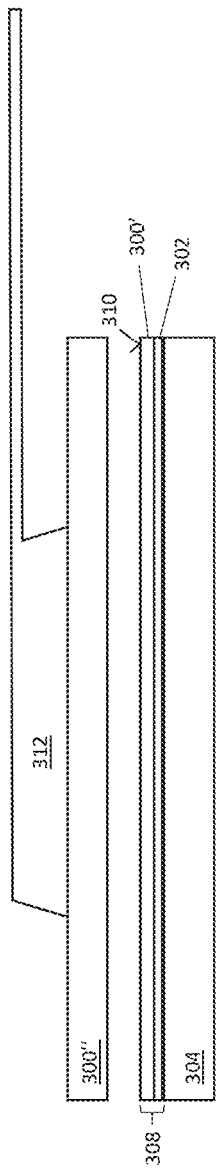

FIG. 3C shows a process step after cutting through the base SiC wafer 300 to separate the product wafer 308 from the base SiC wafer 300. The thinner product wafer 308 includes at least part of the epitaxial SiC layer 302 and possibly part 300' of the base SiC wafer 300, depending on where the original base SiC wafer 300 is cut through, and is attached to the support substrate 304. The thinner product wafer 308 with the support substrate 304 may then be processed further, e.g. by polishing, laser annealing, etc. the cut surface 310 of the thinner product wafer 308 to remove surface damage caused by the WEDM process, forming doped device regions such as source/drain/emitter/collector/anode/cathode regions in the epitaxial SiC layer 302, metallization, etc. The remaining base SiC wafer 300" is carried away by a vacuum collet 312 for at least one additional WEDM cutting process.

Figure 3D:
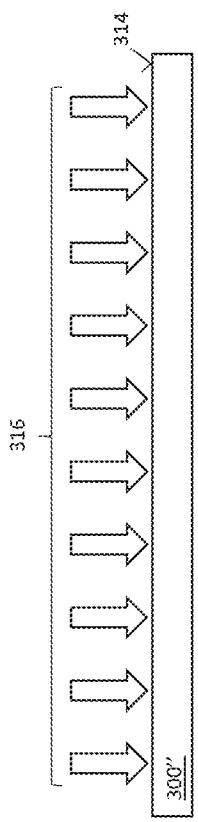

FIG. 3D shows the surface 314 of the base SiC wafer 300" cut by the first WEDM process being processed 316 to remove surface damage caused by the first WEDM process. Any standard processing performed to remove surface damage from a SiC wafer may be used such as, but not limited to, polishing, laser annealing, etc.

Figure 3E:

FIG. 3E shows the remaining base SiC wafer 300" after a new epitaxial SiC layer 318 is grown on the processed surface 314 of the remaining base SiC wafer 300". The new epitaxial SiC layer 318 may be doped or undoped, as explained above, and may or may not include one or more doped device regions such as source/drain/emitter/collector/anode/cathode regions.

Figure 3F:
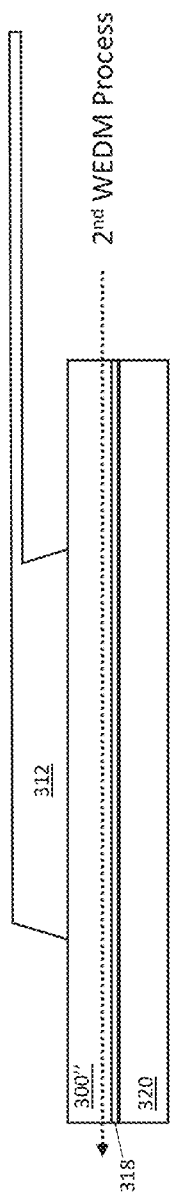

FIG. 3F shows the remaining base SiC wafer 300" with the new epitaxial SiC layer 318 after the wafer 300" is flipped, attached to a support substrate 320 and being cut as part of a second WEDM cutting process to yield a second thinner product wafer.

The process illustrated in FIGS. 3D through 3F may be repeated one or more times to yield further thinner product wafers. The number of product wafers produced from the original base SiC wafer 300 depends on the initial thickness of the base SiC wafer, epitaxial layer thickness, the target thickness for each product wafer cut from the base SiC wafer, and the amount of semiconductor material spent by each instance of the WEDM cutting process, as previously explained herein. In at least one repetition of the process illustrated in FIGS. 3D through 3F, it is possible that the epitaxial layer 302 or the new epitaxial layer 318 is cut with the WEDM cutting process instead of the base SiC wafer 300 or the remaining base Sic wafer 300", respectively.

Figure 4:
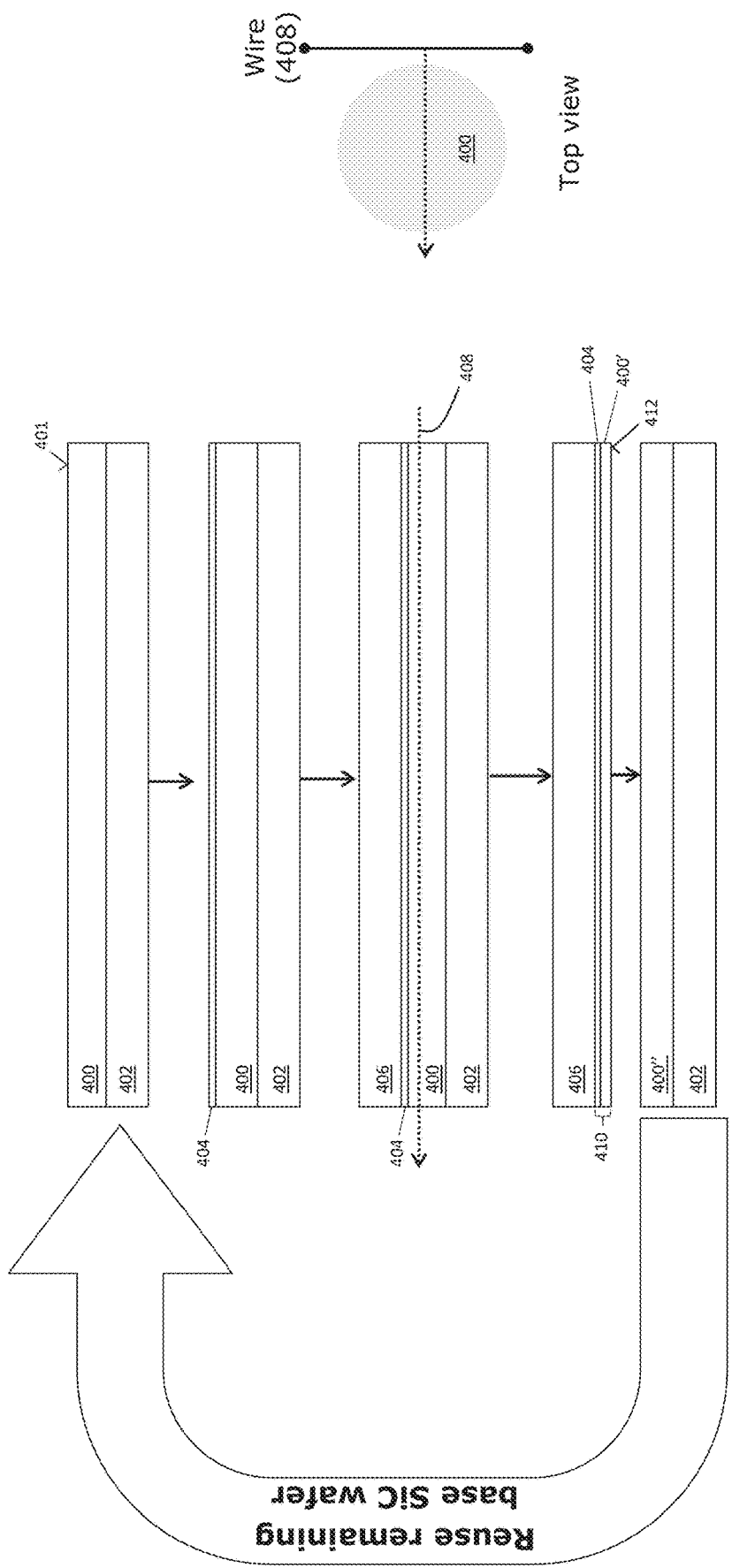
FIG. 4 illustrates side perspective views of an embodiment of the method shown in FIG. 1.

FIG. 4 illustrates another embodiment of the method shown in FIG. 1. According to this embodiment, a base SiC wafer 400 cut from a SiC ingot is supported by a first support substrate 402. An epitaxial SiC layer 404 is then grown on the exposed surface 401 of the base SiC wafer 400. The epitaxial SiC layer 404 may be doped or undoped. In the case of a doped epitaxial SiC layer, the epitaxial SiC layer 404 may include one or more doped device regions such as source/drain/emitter/collector/anode/cathode regions. Any standard SiC epitaxy process may be used to grow the epitaxial SiC layer 404 on the base SiC wafer 400. A second support substrate 406 is then attached to the epitaxial SiC layer 404 so that the base SiC wafer 400 with the epitaxial SiC layer 404 is interposed between the two support substrates 402, 406.

The base SiC wafer 400 with the epitaxial SiC layer 404 is then cut through in a direction parallel to a first main (top or bottom) surface of the base SiC wafer 400 using a wire 408 as part of a WEDM process to separate a thinner product wafer 410 from the base SiC wafer 400. The right-hand side of FIG. 4 shows a top plan view of the WEDM wafer cutting process.

The thinner product wafer 410 includes at least part of the epitaxial SiC layer 404 and possibly part 400' of the base SiC wafer 400, depending on where the original base SiC wafer 400 is cut through, and is attached to the second support substrate 406 which provides support during subsequent processing of the product wafer 410 such as, but not limited to, polishing, laser annealing, etc. of the cut surface 412 to remove surface damage caused by the WEDM process, growing of an epitaxial SiC layer on the polished surface 412, device fabrication e.g. by forming doped device regions such as source/drain/emitter/collector/anode/cathode regions, metallization, etc.

The remaining base SiC wafer 400" is attached to the first support substrate 402. The remaining base SiC wafer 400" may be reused to yield one or more additional thinner product wafers, by repeating the steps explained above and illustrated in FIG. 4. For example, a further epitaxial SiC layer may be grown on the remaining base SiC wafer 400". Said further epitaxial SiC layer may have a thickness that corresponds to at least 70% of the thickness of the removed part of the base SiC wafer 400, i.e., the removed thinner product wafer 410 and additional material removed during the WEDM cutting process and subsequent processing. The number of product wafers produced from the original base SiC wafer 400 depends on the initial thickness of the base SiC wafer, the epitaxial layer thickness, the target thickness for each product wafer cut from the base SiC wafer 400, and the amount of semiconductor material spent by each instance of the WEDM cutting process, as previously explained herein.

FIGS. 5A through 5D illustrate another embodiment of the method shown in FIG. 1.

FIG. 5A shows a base SiC wafer 500 cut from a SiC ingot and supported by a support substrate 502 during an WEDM cutting process. During the WEDM process, the base SiC wafer 500 is cut through in a direction parallel to a first main (top or bottom) surface of the base SiC wafer 500 using a wire 504 to separate a thinner product wafer 506 from the base SiC wafer 500. According to this embodiment, an epitaxial SiC layer is not grown on the base SiC wafer 500 prior to the WEDM cutting process.

FIG. 5B shows the remaining base SiC wafer 500' separated from the thinner product wafer 506 after the WEDM process is complete. The thinner product wafer 506 remains attached to the support substrate 502 after the WEDM process, to provide mechanical stability to the product wafer 506.

FIG. 5C shows the surface 508 of the thinner product wafer 506 cut by the WEDM process subjected to further processing 510 such as polishing, laser annealing, etc. to remove surface damage caused by the WEDM process. Any standard SiC planarizing, polishing and/or surface defect removal process may be used.

FIG. 5D shows the processed surface 508 of the thinner product wafer 506 after an epitaxial SiC layer 512 is grown on the processed surface 508. The epitaxial SiC layer 512 may be doped during the growth process. One or more doped device regions may be formed in the epitaxial SiC layer 512 such as source/drain/emitter/collector/anode/cathode regions to form a power semiconductor device such as a power transistor, power diode, etc. Any standard SiC processing may be used to form the epitaxial SiC layer 512 and the doped device regions. Additional device regions may be formed in and/or above the epitaxial SiC layer 512 such as gate structures, field plates, interlayer dielectrics, metallization layer(s), contact pads, etc. Such exemplary structures are not shown for ease of illustration, and should not be considered limiting.

FIGS. 6A through 6E illustrate another embodiment of the method shown in FIG. 1.

FIG. 6A shows a base SiC wafer 600 cut from a SiC ingot with an epitaxial SiC layer 602 grown on the base SiC wafer 600. The epitaxial SiC layer 602 may be doped or undoped. In the case of a doped epitaxial SiC layer, the epitaxial SiC layer 602 may include one or more doped device regions such as source/drain/emitter/collector/anode/cathode regions. Any standard SiC epitaxy process may be used to grow the epitaxial SiC layer 602 on the base SiC wafer 600. The base SiC wafer 600 may be flipped and attached to a support substrate 604.

FIG. 6B shows the base SiC wafer 600 with the epitaxial SiC layer 602 during a WEDM cutting process in which the base SiC wafer 300 is cut through in a direction parallel to a first main (top or bottom) surface of the base SiC wafer using a wire 606 to separate a thinner product wafer 608 from the base SiC wafer 600. Alternatively, the epitaxial SiC layer 602 may be cut by the WEDM cutting process; in this case, the produced thinner product wafer 608 may only comprise epitaxially grown SiC.

FIG. 6C shows the remaining base SiC wafer 600' separated from the thinner product wafer 608 after the WEDM process is complete. The thinner product wafer 608 remains attached to the support substrate 604 after the WEDM process, to provide mechanical stability to the thinner product wafer 608 during handling and subsequent processing. The thinner product wafer 608 includes at least part of the epitaxial SiC layer 602 grown on the base SiC wafer 600 prior to the WEDM cutting process, and possibly part of the base SiC wafer 600, depending on where the original base SiC wafer 600 is cut through.

FIG. 6D shows the surface 610 of the thinner product wafer 608 cut by the WEDM process subjected to further processing 612 such as polishing, laser annealing, etc. to remove surface damage caused by the WEDM process. Any standard SiC planarizing, polishing and/or surface defect removal process may be used.

FIG. 6E shows the cut surface 610 of the thinner product wafer 608 after the surface processing. One or more doped device regions may be formed in the processed epitaxial SiC layer 602 such as source/drain/emitter/collector/anode/cathode regions to form a power semiconductor device such as a power transistor, power diode, etc. Any standard SiC processing may be used to form the doped device regions and additional device regions such as gate structures, field plates, interlayer dielectrics, metallization layer(s), contact pads, etc. Such exemplary structures are not shown for ease of illustration, and should not be considered limiting.

FIGS. 7A through 7D illustrate another embodiment of the method shown in FIG. 1.

FIG. 7A is similar to FIG. 6A in that an epitaxial SiC layer 702 is grown on a base SiC wafer 700 cut from a SiC ingot. Different than the embodiment shown in FIGS. 6A through 6E, all front-end device processing is completed before the WEDM cutting process. For example, all doped device regions such as source/drain/emitter/collector/anode/cathode regions and related structures such as gate structures, etc. to form a power semiconductor device such as a power transistor, power diode, etc. are formed prior to WEDM cutting. Any standard SiC processing may be used to form the front-end device regions prior to WEDM cutting. As such, only metallization and other back-end processing such as formation of inter-layer dielectrics and contact pads is performed after the WEDM cutting process. Even metallization and related inter-layer dielectrics may be formed on the front (exposed) surface of the epitaxial SiC layer 702 prior to WEDM cutting so that only back-side processing is performed post WEDM cutting.

FIG. 7B shows the base SiC wafer 700 with the epitaxial SiC layer 702 supported by a support substrate 704, during a WEDM cutting process in which the base SiC wafer 700 is cut through in a direction parallel to a first main (top or bottom) surface of the base SiC wafer 700 using a wire 706 to separate a thinner product wafer 708 from the base SiC wafer 700.

FIG. 7C shows the remaining base SiC wafer 700' separated from the thinner product wafer 708 after the WEDM process is complete, with the exposed (cut) surface 710 of the product wafer 708 facing away from the previously processed front surface 712. The thinner product wafer 708 remains attached to the support substrate 704 at the front surface 712 after the WEDM process, to provide mechanical stability.

FIG. 7D shows the exposed (cut) surface 710 of the thinner product wafer 708 after a metallization layer 714 is formed on the cut surface 710. The metallization layer 714 may form a power semiconductor device terminal (e.g. in the case of vertical devices), may provide a heat transfer path (e.g. in the case of vertical or lateral devices) or both (e.g. in the case of vertical devices). Different than the embodiment shown in FIGS. 6A through 3E, surface damage caused by the WEDM cutting process is not removed and the metallization layer 714 is formed directly on the damaged (cut) surface 710.

Figure 8:
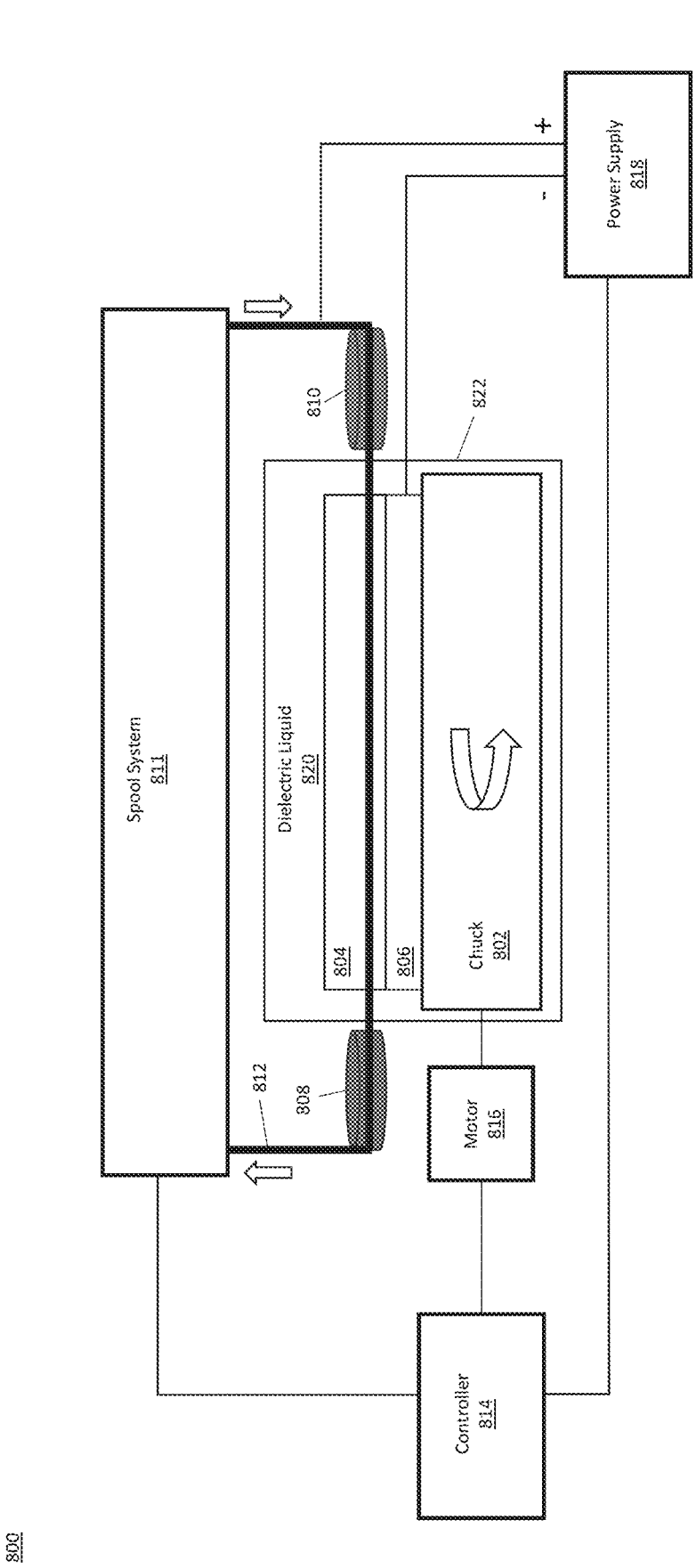
FIG. 8 illustrates a block diagram of an embodiment of a WEDM apparatus for implementing the method shown in FIG. 1.

FIG. 8 illustrates an embodiment of a wire electrical discharge machining (WEDM) apparatus 800 for implementing the WEDM cutting embodiments described herein. The WEDM apparatus 800 includes a chuck 802 configured to receive a base SiC wafer 804 attached to a support substrate 806. The base SiC wafer 804 may or may not include an epitaxial SiC layer. The chuck 802 is configured to rotate the base SiC wafer 804 with the support substrate 806 during a WEDM cutting process. The WEDM apparatus 800 also includes a pair of spools 808, 810 which are part of a spool system 811 configured to feed a wire (foil) 812 suitable for WEDM cutting.

The WEDM apparatus 800 further includes a controller 814 configured to control rotation of the chuck 802 e.g. via a motor 816 which drives the chuck 802, and feeding of the wire 812 between the pair of spools 808, 810 so as to cut through the base SiC wafer 804 in a direction parallel to a first main (top or bottom) surface of the base SiC wafer 804 using the wire 812 during a WEDM process and separate a product wafer from the base SiC wafer 804, the product wafer being attached to the support substrate 806 when cut from the base SiC wafer 804. The controller 814 also controls a power supply 818, to control the type of voltage pulses applied during the WEDM cutting process.

As explained above, the WEDM process cuts through the base SiC wafer 804 in a generally horizontal direction by machining/removing semiconductor material by sublimation, melting, decomposition and/or spalling. The tool electrode is the wire (foil) 812, which is feed between the pair of spools 808, 810 so that the active part of the wire 812 may be changed. The base SiC wafer 804 and/or an electrode applied to the wafer 804 forms the other electrode used during the WEDM process. The power supply 818 applies voltage pulses between the wire 812 and the other electrode as part of the WEDM process. No direct physical contact occurs between the wire 812 and the base SiC wafer 804. Hence, the WEDM process may be used to cut through semiconductor material much harder than the wire 812, e.g. such as SiC.

A dielectric liquid 820 may be applied to at least one of the wire 812 and the base SiC wafer 804 to aid the WEDM process. For example, the dielectric liquid 820 is applied between the wire 812 and the base SiC wafer 804. The dielectric liquid 820 may be an oil-based dielectric or a water-based dielectric. The dielectric liquid 820 may be pumped into a tank or chamber 822 that contains the base SiC wafer 804 and/or wire 812, and may be filtered to remove contaminants generated by the WEDM process.

Figure 9:
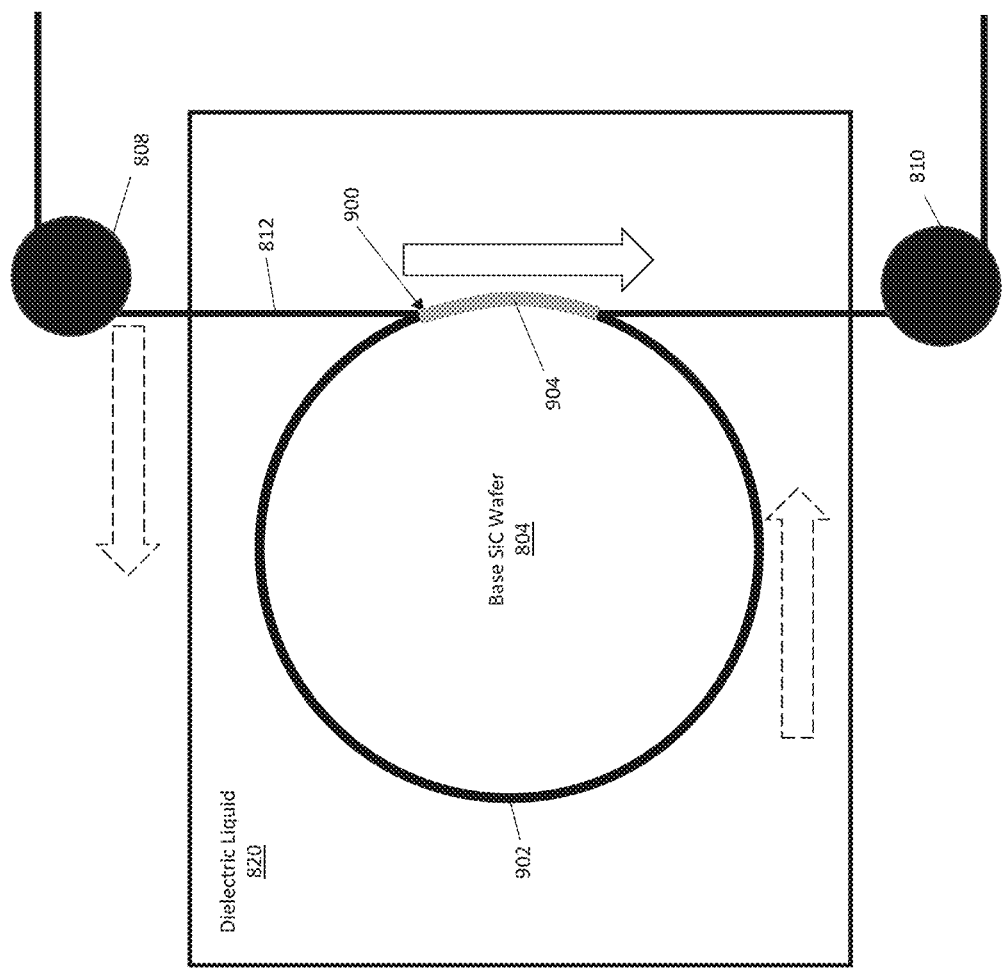
FIG. 9 illustrates a top plan view of an embodiment of a wafer cutting configuration for the WEDM apparatus shown in FIG. 8.

FIG. 9 illustrates an embodiment of a wafer cutting configuration for the WEDM apparatus 800 shown in FIG. 8. According to this embodiment, the wire 812 is moved in a direction transverse to a side face 900 of the base SiC wafer 804 as the wire 812 cuts through the base SiC wafer 804. The transverse movement of the wire 812 is indicted by the downward-facing solid arrow in FIG. 9. The wire 802 is also moved toward the base SiC wafer 804 and/or the base SiC wafer 804 is moved toward the wire 812 so that the wire 812 continues to cut through the base SiC wafer 804 during the WEDM process to yield a thinner product wafer. This movement is indicted by the leftward and rightward-facing dashed arrows in FIG. 9.

In one embodiment, the dielectric liquid 820 is an oil-based dielectric and an assisting electrode 902 is formed on the side face 900 of the base SiC wafer 804 i.e. the edge of the base SiC wafer 804 being cut. The assisting electrode 902 may have a greater electrical conductivity than the base SiC wafer 804 so that substantial current does not flow vertically through the base SiC wafer 804 during the WEDM cutting process. The assisting electrode 902 may be deposited on the side face 900 of the base SiC wafer 804. For example, a metal layer or a carbon layer may be deposited on the side face 900 of the base SiC wafer 804. In a more specific embodiment, a carbon-based lacquer may be screen printed onto the side face 900 of the base SiC wafer 804 and dried to form the assisting electrode 902. In another embodiment, the assisting electrode 902 may be a conductive paste applied to the side face 900 of the base SiC wafer 804.

The power supply 818, under the control of the WEDM apparatus controller 814, applies voltage pulses between the assisting electrode 902 at the side face 900 of the base SiC wafer 804 and the wire 812 prior to the assisting electrode 902 being removed by the WEDM process. After the assisting electrode 902 is removed from the side face 900 of the base SiC wafer 804 as part of the WEDM process, the voltage pulses are applied between the wire 812 and an intrinsic conductive layer 904 which forms on the part of the side face 900 of the base SiC wafer 804 being cut by the wire 812.

Plasma produced during sparking may crack the dielectric liquid 820, forming a pyrostatic carbon. Once the assisting electrode 902 has been removed, and the side face 900 of the base SiC wafer 804 is exposed, pyrostatic carbon may deposit on the exposed side face 900 of the base SiC wafer 804. The deposited pyrostatic carbon may form the intrinsic conductive layer 904 on the part of the side face 900 of the base SiC wafer 804 being cut by the wire 812. The intrinsic conductive layer 904 provides electrical conductivity which allows for continued cutting of the base SiC wafer 804 with successive sparks caused by voltage pulses applied by the power supply 818 between the wire 812 and the intrinsic conductive layer 904 formed on the side face 900 of the base SiC wafer 804 after the assisting electrode 902 is removed in this region by the WEDM process, and as material such as ions and/or chunks of semiconductor are being removed from the base SiC wafer 804 during the WEDM process.

As the assisting electrode 902 is removed from the side face 900 of the base SiC wafer 804, and with every additional spark, a part of the base SiC wafer 804 is removed and pyrostatic carbon may be deposited thereon to maintain the intrinsic conductive layer 904. The intrinsic conductive layer 904 generated by the WEDM process may be removed e.g. by an oven process and/or by use of an oxygen-rich plasma, or instead used as a seed layer for a subsequent electroplating process in which metal is deposited on the cut surface of the thinner product wafer cut from the base SiC wafer 804. In addition, or as an alternative, the intrinsic conductive layer 904 may be removed and an additional metal layer may be deposited on the cut surface of the thinner product wafer, e.g., as shown in FIG. 7D, wherein the additional metal layer may be used as a seed layer for a subsequent electroplating process.

The open source voltage applied by the power supply 818 may range from 14 V to 200 V, for example. The current of the pulses applied by the power supply 818 may range from 0.1 to 100 Amperes, for example. The duration of the pulses may be varied as desired, as may be the off time between pulses. The WEDM process may be stopped one or more times during the cutting process, for example for several seconds at a time, to ensure availability of fresh dielectric. For example, used (e.g. dirty) dielectric liquid may be replaced with new dielectric liquid. The WEDM apparatus 800 may automatically replace the wire during the WEDM process via the spool system 811, to maintain electrode integrity. When a pulse starts to take place, the diameter of the resulting plasma region formed between the wire 812 and the base SiC wafer 804 or assisting electrode/intrinsic conductive layer 902/904 depends on the pulse on time. The controller 814 may control the duration of the pulses to control the degree or localization of the plasma created by the WEDM process. For a large pulse duration, the plasma may be bigger. In the microsecond EDM range, the plasma diameter is smaller and hence the amount of joule heating may be relatively small and a small localized region of the base SiC wafer 804 is affected.

FIG. 10 illustrates another embodiment of a wafer cutting configuration for the WEDM apparatus 800 shown in FIG. 8. The embodiment shown in FIG. 10 is similar to the embodiment shown in FIG. 9. Different, however, an assisting electrode is not initially formed and/or maintained on the side face 900 of the base SiC wafer 804 cut by the WEDM process. Rather, the base SiC wafer 804 and/or an epitaxial SiC layer grown on the base SiC wafer 804 has a doped region with a sufficiently high enough conductivity to function as the other electrode during the WEDM cutting process. In addition, or as an alternative, an intrinsic conductive layer as explained above may form during the WEDM cutting process. For example, the base SiC wafer 804 and/or an epitaxial SiC layer grown on the base SiC wafer 804 may have a doped region with a conductivity of greater than 0.01 siemens(S)/cm (or a resistivity of less than 100 Ωcm). According to this embodiment, the power supply 818, under the control of the WEDM apparatus controller 814, applies voltage pulses between the base SiC wafer 804 and the wire 812 as the wire 812 cuts through the doped region. Since no assisting electrode is used in this case, the dielectric liquid 820 may be a water-based dielectric. However, an oil-based or other type of dielectric liquid 820 may be used. The base SiC wafer 804 may be rotated, via the chuck 802 and corresponding motor 816 of the WEDM apparatus 800, as the wire 812 cuts through the base SiC wafer 804 during the WEDM process. Rotation of the base SiC wafer 804 is indicated by a circular arrow in FIG. 10. In contrast to this, as shown in connection with FIG. 9, the base SiC wafer 804 may be free of a rotation. A rotating base SiC wafer 804 may result removal of the assisting electrode 902, which may be unfavourable if no intrinsic conductive layer is built in the base SiC wafer 804 and/or if the base SiC wafer 804 has no intrinsic conductivity.

FIGS. 11A and 11B illustrate another embodiment of the method shown in FIG. 1. FIG. 11A shows a base SiC wafer 1000 during the WEDM cutting process. Before cutting through the base SiC wafer 1000 to separate a thinner product wafer from the base SiC wafer 1000, a first epitaxial SiC layer 1002 is formed on the top main surface of the base SiC wafer 1000 and a second epitaxial SiC layer 1004 is formed on the bottom main surface of the base SiC wafer 1000. The first epitaxial SiC layer 1002 may have a Si-face facing away from the base SiC wafer 1000, and the second epitaxial SiC layer 1004 may have a C-face facing away from the base SiC wafer 1000. Other Si- and C-face orientations are contemplated. Support substrates 1006, 1008 may be attached to the opposing epitaxial SiC layers 1002, 1004. The right-hand side of FIG. 11A shows a top plan view of the WEDM wafer cutting process.

FIG. 11B shows the base SiC wafer 1000 with the opposing epitaxial SiC layers 1002, 1004 after cutting through the base SiC wafer 1000 via a wire 1010 as part of the WEDM process. The \A/EDM process yields a first product wafer 1012 and a second product wafer 1014 separated from each other and from the base SiC wafer 1000. The first product wafer 1012 includes at least part of the first epitaxial SiC layer 1002 and possibly part 1000' of the base SiC wafer 1000, depending on where the original base SiC wafer 1000 is cut through, and is attached to the first support substrate 1006. The second product wafer 1014 includes at least part of the second epitaxial SiC layer 1004 and possibly part 1000" of the base SiC wafer 1000, depending on where the original base SiC wafer 1000 is cut through, and is attached to the second support substrate 1008. Before cutting through the base SiC wafer 1000 to separate the thinner product wafers 1012, 1014 from each other and from the base SiC wafer 1000, dopants may be implanted into at least one of the epitaxial SiC layers 1002, 1004. Before cutting through the base SiC wafer 1000 to separate the thinner product wafers 1012, 1014 from each other and from the base SiC wafer 1000, the base SiC wafer 1000 with the epitaxial SiC layers 1002, 1004 may be annealed to activate dopants contained in the epitaxial SiC layers 1002, 1004. The doping and/or annealing may be done after the WEDM cutting, instead.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc., and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

In the following, further embodiments of the method, the wire electrical discharge machining (WEDM) apparatus and the SiC product wafer as described herein are explained in detail. It is to be understood that the features mentioned above and those yet to be explained below may be used not only in the respective combinations indicated, but also in other combinations or in isolation without departing from the scope of the invention. The WEDM apparatus may be used to perform a method as described herein. Further, the SiC product wafer may be produced with a method as described herein. That is to say, all features described in connection with the method may also be disclosed for the WEDM apparatus and/or the SiC product wafer and vice versa.

According to an embodiment of a method of yielding a thinner product wafer from a thicker base SiC wafer cut from a SiC ingot, the method comprises: supporting the base SiC wafer with a support substrate; and while the base SiC wafer is supported by the support substrate, cutting through the base SiC wafer in a direction parallel to a first main surface of the base SiC wafer using a wire as part of a wire electrical discharge machining (WEDM) process, to separate the product wafer from the base SiC wafer, the product wafer being attached to the support substrate when cut from the base SiC wafer.

According to at least one embodiment of the method, the method comprises forming an epitaxial SiC layer on a surface of the product wafer facing away from the support substrate. The epitaxial SiC layer may be formed after cutting through the base SiC wafer to separate the product wafer from the base SiC wafer.

According to at least one embodiment of the method, the method comprises processing the surface of the product wafer facing away from the support substrate. The processing may result in removal of surface damage caused by the WEDM process. Processing the surface may be performed after cutting through the base SiC wafer to separate the product wafer from the base SiC wafer and/or before forming the epitaxial SiC layer.

According to at least one embodiment of the method, the method comprises forming an epitaxial SiC layer on the first main surface of the base SiC wafer. Said epitaxial SiC layer may be formed before cutting through the base SiC wafer to separate the product wafer from the base SiC wafer. After cutting through the base SiC wafer to separate the product wafer from the base SiC wafer, the product wafer may comprise at least part of the epitaxial SiC layer. For example, the product wafer may comprise the entire epitaxial SiC layer.

It is possible that supporting the base SiC wafer with the support substrate comprises attaching the support substrate to a surface of the epitaxial SiC layer which faces away from the base SiC wafer so that the epitaxial SiC layer is interposed between the support substrate and the base SiC wafer.

In at least one embodiment of the method, the method comprises processing a surface of the epitaxial SiC layer cut by the WEDM. By this, surface damage caused by the WEDM process may be removed. The processing may be performed after cutting through the base SiC wafer to separate the product wafer from the base SiC wafer.

According to at least one embodiment, the method comprises forming one or more doped regions in the epitaxial layer. The one or more doped regions may be formed before cutting through the base SiC wafer to separate the product wafer from the base SiC wafer.

According to at least one embodiment of the method, the method comprises attaching an additional support substrate to a surface of the base SiC wafer which faces away from the epitaxial SiC layer so that the base SiC wafer with the epitaxial SiC layer is interposed between the support substrate and the additional support substrate. The additional support substrate may be attached before cutting through the base SiC wafer to separate the product wafer from the base SiC wafer.

According to at least one embodiment of the method, the product wafer separated from the base SiC wafer is cut to a thickness of less than 100 µm by the WEDM process. It is particularly possible for the product wafer separated from the base SiC wafer to be cut to a thickness of less than 20 µm by the WEDM process.

According to at least one embodiment of the method, the method comprises re-supporting the base SiC wafer with the same or different support substrate after cutting through the base SiC wafer to separate the product wafer from the base SiC wafer. The method may further comprise cutting through the base SiC wafer using the same or different wire as part of a new WEDM process, to separate a new product wafer from the base SiC wafer. The new product wafer may be attached to the support substrate when cut from the base SiC wafer. The new WEDM process may be performed after re-supporting the base SiC wafer.

According to at least one embodiment of the method, the method comprises processing a cut surface of the base SiC wafer along which the product wafer is separated to remove surface damage caused by the WEDM process. The processing may be carried out after the product wafer is separated from the base SiC wafer and/or before the new product wafer is separated from the base SiC wafer.

According to at least one embodiment of the method, the WEDM process comprises applying a dielectric liquid between the wire and the base SiC wafer. The WEDM process may further comprise moving the wire in a direction transverse to a side face of the base SiC wafer as the wire cuts through the base SiC wafer. The dielectric liquid may be an oil-based dielectric. Alternatively, the dielectric liquid may be a water-based dielectric.

According to at least one embodiment of the method the WEDM process comprises forming an electrode on the side face of the base SiC wafer. The electrode may be removed by the WEDM process, for example as the side face is being cut by the wire. Further, the WEDM process may comprise applying voltage pulses between the electrode at the side face of the base SiC wafer and the wire, in particular before the electrode is removed by the WEDM process. In addition or as an alternative, voltage pulses may be applied between the wire and an intrinsic conductive layer formed on the side face of the semiconductor wafer, in particular after the electrode is removed by the WEDM process. The intrinsic conductive layer may, for instance, form in connection with an oil-based dielectric as a dielectric liquid.

According to at least one embodiment of the method, the base SiC wafer or an (optional) epitaxial SiC layer formed on the base SiC wafer has a doped region. In this case, the WEDM process may comprise applying voltage pulses between the base SiC wafer and the wire as the wire cuts through the doped region.

In at least one embodiment of the method, the base SiC wafer is rotated as the wire cuts through the base SiC wafer during the WEDM process. Voltage pulses may be applied between the base SiC wafer and the wire as the base SiC wafer rotates. If the base SiC wafer or an epitaxial SiC layer formed on the base SiC wafer has a doped region, the voltage pulses can be applied between the base SiC wafer and the wire as the base SiC wafer rotates and the wire cuts through the doped region.

According to at least one embodiment of the method, the method comprises forming a first epitaxial SiC layer on the first main surface of the base SiC wafer and a second epitaxial SiC layer on a second main surface of the base SiC wafer opposite the first main surface. The first epitaxial SiC layer and the second epitaxial SiC layer may be formed before cutting through the base SiC wafer to separate the product wafer from the base SiC wafer. The first epitaxial SiC layer may have a Si-face facing away from the base SiC wafer and/or the second epitaxial SiC layer may have a C-face facing away from the base SiC wafer. Cutting through the base SiC wafer may yield the product wafer which comprises at least part of the first epitaxial SiC layer and yields an additional product wafer separated from the base SiC wafer which comprises at least part of the second epitaxial SiC layer.

In at least one embodiment of the method, dopants are implanted into at least one of the first epitaxial SiC layer and the second epitaxial SiC layer. The dopants may be implanted before cutting through the base SiC wafer to separate the product wafer from the base SiC wafer.

According to at least one further embodiment of the method, the method comprises annealing the base SiC wafer with the first epitaxial SiC layer and the second epitaxial SiC layer to activate dopants contained in the first epitaxial SiC layer and in the second epitaxial SiC layer, in particular before cutting through the base SiC wafer to separate the product wafer from the base SiC wafer.

In at least one embodiment of the method, an epitaxial SiC layer is formed on the first main surface of the base SiC wafer. Further, one or more functional devices are formed in the epitaxial SiC layer. The epitaxial SiC layer and the one or more functional devices may be formed before cutting through the base SiC wafer to separate the product wafer from the base SiC wafer. After cutting through the base SiC wafer to separate the product wafer from the base SiC wafer, the product wafer may comprise at least part of the epitaxial SiC layer.

In at least one embodiment of the method, a metallization layer is formed on a cut surface of the product wafer formed by the WEDM process, in particular after cutting through the base SiC wafer to separate the product wafer from the base SiC wafer.

According to at least one embodiment of a wire electrical discharge machining (WEDM) apparatus, said WEDM apparatus comprises a chuck configured to receive a base SiC wafer with a support substrate, and to rotate the base SiC wafer and the support substrate during a WEDM process. The WEDM apparatus further comprises first and second spools configured to feed a wire and a controller configured to control rotation of the chuck and feeding of the wire between the first and the second spools so as to cut through the base SiC wafer in a direction parallel to a first main surface of the base SiC wafer using the wire during the WEDM process and separate a product wafer from the base SiC wafer, the product wafer being attached to the support substrate when cut from the base SiC wafer.

According to at least one embodiment of a SiC product wafer, said SiC product wafer comprises a SiC body having a thickness of less than 100 µm and being devoid of implanted hydrogen.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of yielding a thinner product wafer from a thicker base SiC wafer cut from a SiC ingot, the method comprising:
    supporting the base SiC wafer with a support substrate;
    while the base SiC wafer is supported by the support substrate, cutting through the base SiC wafer in a direction parallel to a first main surface of the base SiC wafer using a wire as part of a wire electrical discharge machining (WEDM) process, to separate the product wafer from the base SiC wafer, the product wafer being attached to the support substrate when cut from the base SiC wafer, wherein the WEDM process comprises applying a dielectric liquid between the wire and the base SiC wafer and moving the wire in a direction transverse to a side face of the base SiC wafer as the wire cuts through the base SiC wafer; and
    rotating the base SiC wafer as the wire cuts through the base SiC wafer during the WEDM process.

2. The method of claim 1, further comprising:
    after cutting through the base SiC wafer to separate the product wafer from the base SiC wafer, forming an epitaxial SiC layer on a surface of the product wafer facing away from the support substrate.

3. The method of claim 2, further comprising:
    after cutting through the base SiC wafer to separate the product wafer from the base SiC wafer and before forming the epitaxial SiC layer, processing the surface of the product wafer facing away from the support substrate to remove surface damage caused by the WEDM process.

4. The method of claim 1, further comprising:
    before cutting through the base SiC wafer to separate the product wafer from the base SiC wafer, forming an epitaxial SiC layer on the first main surface of the base SiC wafer,
    wherein supporting the base SiC wafer with the support substrate comprises attaching the support substrate to a surface of the epitaxial SiC layer which faces away from the base SiC wafer so that the epitaxial SiC layer is interposed between the support substrate and the base SiC wafer,
    wherein after cutting through the base SiC wafer to separate the product wafer from the base SiC wafer, the product wafer comprises at least part of the epitaxial SiC layer.

5. The method of claim 4, further comprising:
    after cutting through the base SiC wafer to separate the product wafer from the base SiC wafer, processing a surface of the epitaxial SiC layer cut by the WEDM process to remove surface damage caused by the WEDM process.

6. The method of claim 4, further comprising:
    before cutting through the base SiC wafer to separate the product wafer from the base SiC wafer, forming one or more doped regions in the epitaxial SiC layer.

7. The method of claim 4, further comprising:
    before cutting through the base SiC wafer to separate the product wafer from the base SiC wafer, attaching an additional support substrate to a surface of the base SiC wafer which faces away from the epitaxial SiC layer so that the base SiC wafer with the epitaxial SiC layer is interposed between the support substrate and the additional support substrate.

8. The method of claim 1, wherein the product wafer separated from the base SiC wafer is cut to a thickness of less than 100 µm by the WEDM process.

9. The method of claim 1, wherein the product wafer separated from the base SiC wafer is cut to a thickness of less than 20 µm by the WEDM process.

10. The method of claim 1, further comprising:
    after cutting through the base SiC wafer to separate the product wafer from the base SiC wafer, re-supporting the base SiC wafer with the same or different support substrate; and
    after re-supporting the base SiC wafer, cutting through the base SiC wafer using the same or different wire as part of a new WEDM process, to separate a new product wafer from the base SiC wafer, the new product wafer being attached to the support substrate when cut from the base SiC wafer.

11. The method of claim 10, further comprising:
    after the product wafer is separated from the base SiC wafer and before the new product wafer is separated from the base SiC wafer, processing a cut surface of the base SiC wafer along which the product wafer is separated to remove surface damage caused by the WEDM process.

12. The method of claim 1, wherein the dielectric liquid is an oil-based dielectric, and wherein the WEDM process comprises:
    forming an electrode on the side face of the base SiC wafer; and
    applying voltage pulses between the electrode at the side face of the base SiC wafer and the wire before the electrode is removed by the WEDM process, and between the wire and an intrinsic conductive layer formed on the side face of the semiconductor wafer after the electrode is removed by the WEDM process and as the side face is being cut by the wire.

13. The method of claim 1, wherein the base SiC wafer or an epitaxial SiC layer formed on the base SiC wafer has a doped region, and wherein the WEDM process comprises:
    applying voltage pulses between the base SiC wafer and the wire as the wire cuts through the doped region.

14. The method of claim 13, wherein the dielectric liquid is a water-based dielectric.

15. The method of claim 1, wherein the base SiC wafer or an epitaxial SiC layer formed on the base SiC wafer has a doped region, and wherein the WEDM process comprises:
    applying voltage pulses between the base SiC wafer and the wire as the base SiC wafer rotates and the wire cuts through the doped region.

16. The method of claim 1, further comprising:
    before cutting through the base SiC wafer to separate the product wafer from the base SiC wafer, forming a first epitaxial SiC layer on the first main surface of the base SiC wafer and a second epitaxial SiC layer on a second main surface of the base SiC wafer opposite the first main surface, wherein the first epitaxial SiC layer has a Si-face facing away from the base SiC wafer, wherein the second epitaxial SiC layer has a C-face facing away from the base SiC wafer, wherein cutting through the base SiC wafer yields the product wafer which comprises at least part of the first epitaxial SiC layer and yields an additional product wafer separated from the base SiC wafer which comprises at least part of the second epitaxial SiC layer.

17. The method of claim 16, further comprising:

before cutting through the base SiC wafer to separate the product wafer from the base SiC wafer, implanting dopants into at least one of the first epitaxial SiC layer and the second epitaxial SiC layer.

18. The method of claim 16, further comprising:

before cutting through the base SiC wafer to separate the product wafer from the base SiC wafer, annealing the base SiC wafer with the first epitaxial SiC layer and the second epitaxial SiC layer to activate dopants contained in the first epitaxial SiC layer and in the second epitaxial SiC layer.

19. The method of claim 1, further comprising:

before cutting through the base SiC wafer to separate the product wafer from the base SiC wafer, forming an epitaxial SiC layer on the first main surface of the base SiC wafer and forming one or more functional devices in the epitaxial SiC layer, wherein after cutting through the base SiC wafer to separate the product wafer from the base SiC wafer, the product wafer comprises at least part of the epitaxial SiC layer.

20. The method of claim 19, further comprising:

after cutting through the base SiC wafer to separate the product wafer from the base SiC wafer, forming a metallization layer on a cut surface of the product wafer formed by the WEDM process.

\* \* \* \* \*

UNITED STATES PATENT AND TRADEMARK OFFICE
CERTIFICATE OF CORRECTION

PATENT NO. : 10,967,450 B2
APPLICATION NO. : 15/971830
DATED : April 6, 2021
INVENTOR(S) : N. Ojha et al.

Page 1 of 1

It is certified that error appears in the above-identified patent and that said Letters Patent is hereby corrected as shown below:

On the Title Page

Item [57], Line 3, change "substrate: and" to -- substrate; and --

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*